United States Patent
Pagaila

(10) Patent No.: US 8,368,187 B2
(45) Date of Patent: Feb. 5, 2013

(54) SEMICONDUCTOR DEVICE AND METHOD OF FORMING AIR GAP ADJACENT TO STRESS SENSITIVE REGION OF THE DIE

(75) Inventor: Reza A. Pagaila, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 350 days.

(21) Appl. No.: 12/699,431

(22) Filed: Feb. 3, 2010

(65) Prior Publication Data
US 2011/0186973 A1 Aug. 4, 2011

(51) Int. Cl.
*H01L 23/552* (2006.01)
*H01L 21/50* (2006.01)
*H01L 23/52* (2006.01)

(52) U.S. Cl. ...................................... 257/660

(58) Field of Classification Search .................. 257/100, 257/660, E21.499, E23.114, E23.141, 737, 257/782, E21.599, 433, 434, 678–733, E21.597, 257/738, 772, 779–781, 310–311, 374, 389, 257/410, 411; 438/109, 122, 124, 55, 176, 438/177, 123, 127
See application file for complete search history.

(56) References Cited

U.S. PATENT DOCUMENTS

| 5,250,843 | A | 10/1993 | Eichelberger |
| 5,353,498 | A | 10/1994 | Fillion et al. |
| 5,841,193 | A | 11/1998 | Eichelberger |
| 5,969,461 | A * | 10/1999 | Anderson et al. ......... 310/313 R |
| 6,815,869 | B2 * | 11/2004 | Baba et al. ............... 310/313 R |
| 6,933,605 | B2 | 8/2005 | Tao et al. |
| 7,619,901 | B2 | 11/2009 | Eichelberger et al. |
| 7,871,865 | B2 * | 1/2011 | Sengupta et al. ............. 438/126 |
| 8,021,930 | B2 * | 9/2011 | Pagaila ........................ 438/124 |
| 2004/0150081 | A1 * | 8/2004 | Ogawa ........................... 257/678 |
| 2005/0001331 | A1 * | 1/2005 | Kojima et al. ................ 257/778 |
| 2008/0128882 | A1 * | 6/2008 | Baek et al. .................... 257/686 |
| 2008/0176362 | A1 * | 7/2008 | Sengupta et al. ............. 438/123 |
| 2008/0261350 | A1 * | 10/2008 | Daves et al. .................. 438/106 |
| 2008/0315230 | A1 * | 12/2008 | Murayama ...................... 257/98 |
| 2011/0059582 | A1 * | 3/2011 | Liu ............................... 438/123 |
| 2011/0140283 | A1 * | 6/2011 | Chandra et al. ............... 257/777 |
| 2011/0147911 | A1 * | 6/2011 | Kohl et al. .................... 257/686 |

* cited by examiner

*Primary Examiner* — Dao H Nguyen
*Assistant Examiner* — Tram H Nguyen
(74) *Attorney, Agent, or Firm* — Robert D. Atkins; Patent Law Group: Atkins & Associates, P.C.

(57) ABSTRACT

A semiconductor device is made by mounting an insulating layer over a temporary substrate. A via is formed through the insulating layer. The via is filled with conductive material. A semiconductor die has a stress sensitive region. A dam is formed around the stress sensitive region. The semiconductor die is mounted to the conductive via. The dam creates a gap adjacent to the stress sensitive region. An encapsulant is deposited over the semiconductor die. The dam blocks the encapsulant from entering the gap. The temporary substrate is removed. A first interconnect structure is formed over the semiconductor die. The gap isolates the stress sensitive region from the first interconnect structure. A shielding layer or heat sink can be formed over the semiconductor die. A second interconnect structure can be formed over the semiconductor die opposite the first interconnect structure.

25 Claims, 12 Drawing Sheets

SEMICONDUCTOR DEVICE AND METHOD OF FORMING AIR GAP ADJACENT TO STRESS SENSITIVE REGION OF THE DIE

FIELD OF THE INVENTION

The present invention relates in general to semiconductor devices and, more particularly, to a wafer level package and method of forming an air gap adjacent to a stress sensitive region of a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. An increase in device performance can be accomplished by forming active components that are capable of operating at higher speeds. In some high-performance semiconductor devices, a large number of digital circuits operate with a high frequency clock, e.g., a microprocessor operating in gigahertz range. In other high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions.

These high-performance semiconductor devices have regions that are particularly sensitive to various forms of stress, e.g. thermally induced stress. For example, FIG. 1 shows a conventional wafer level chip scale package (WLCSP) 10 containing semiconductor die 12 having stress sensitive region 14. Region 14 contains high frequency signal processing circuits which are sensitive to stress. A build-up interconnect structure 16 is formed over semiconductor die 12 such that the interconnect structure physically contacts region 14. Encapsulant 18 is deposited over semiconductor die 12 and interconnect structure 16.

Due to differences in the coefficient of thermal expansion (CTE) between region 14 and interconnect structure 16, the high frequency region can be exposed to stress which can interfere with signal processing, cause device failure, and reduce the life expectancy of the device.

SUMMARY OF THE INVENTION

A need exists to reduce stress on the high frequency region of a semiconductor die in a wafer level chip scale package. Accordingly, in one embodiment, the present invention is a method of making a semiconductor device comprising the steps of providing a temporary substrate, mounting a first insulating layer over the temporary substrate, forming a via through the first insulating layer, filling the via with conductive material to form a conductive via, providing a first semiconductor die having a stress sensitive region, forming a dam around the stress sensitive region, and mounting the first semiconductor die to the conductive via. The dam creates a gap adjacent to the stress sensitive region. The method further includes the steps of depositing an encapsulant over the first semiconductor die. The dam blocks the encapsulant from entering the gap. The method further includes the steps of removing the temporary substrate, and forming a first interconnect structure over the first semiconductor die. The gap isolates the stress sensitive region from the first interconnect structure.

In another embodiment, the present invention is a method of making a semiconductor device comprising the steps of providing a temporary substrate, mounting a first insulating layer over the temporary substrate, forming a notch in the first insulating layer, and mounting a first semiconductor die over the notch. The notch creates a gap adjacent to the stress sensitive region. The method further includes the steps of depositing an encapsulant over the first semiconductor die, removing the temporary substrate, and forming a first interconnect structure over the first semiconductor die. The gap isolates the stress sensitive region from the first interconnect structure.

In another embodiment, the present invention is a method of making a semiconductor device comprising the steps of providing a first insulating layer, forming an opening in the first insulating layer, filling the opening with conductive material to form a conductive layer, providing a first semiconductor die having a stress sensitive region, forming a dam around the stress sensitive region, and mounting the first semiconductor die to the conductive layer. The dam creates a gap adjacent to the stress sensitive region. The method further includes the step of depositing an encapsulant over the first semiconductor die. The dam blocks the encapsulant from entering the gap.

In another embodiment, the present invention is a semiconductor device comprising a first insulating layer and conductive layer formed in the first insulating layer. A first semiconductor die has a stress sensitive region. A dam is formed around the stress sensitive region. The first semiconductor die is mounted to the conductive layer so that the dam creates a gap adjacent to the stress sensitive region. An encapsulant is deposited over the first semiconductor die. The dam blocks the encapsulant from entering the gap.

DETAILED DESCRIPTION OF THE DRAWINGS

Figure 1:
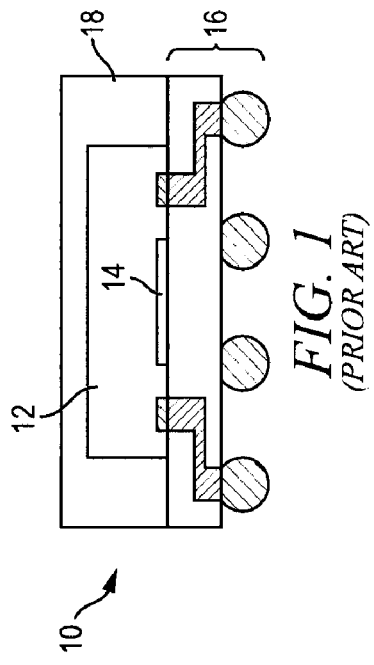
FIG. 1 illustrates a conventional WLCSP with a semiconductor die having a stress sensitive region in physical contact with the interconnect structure.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
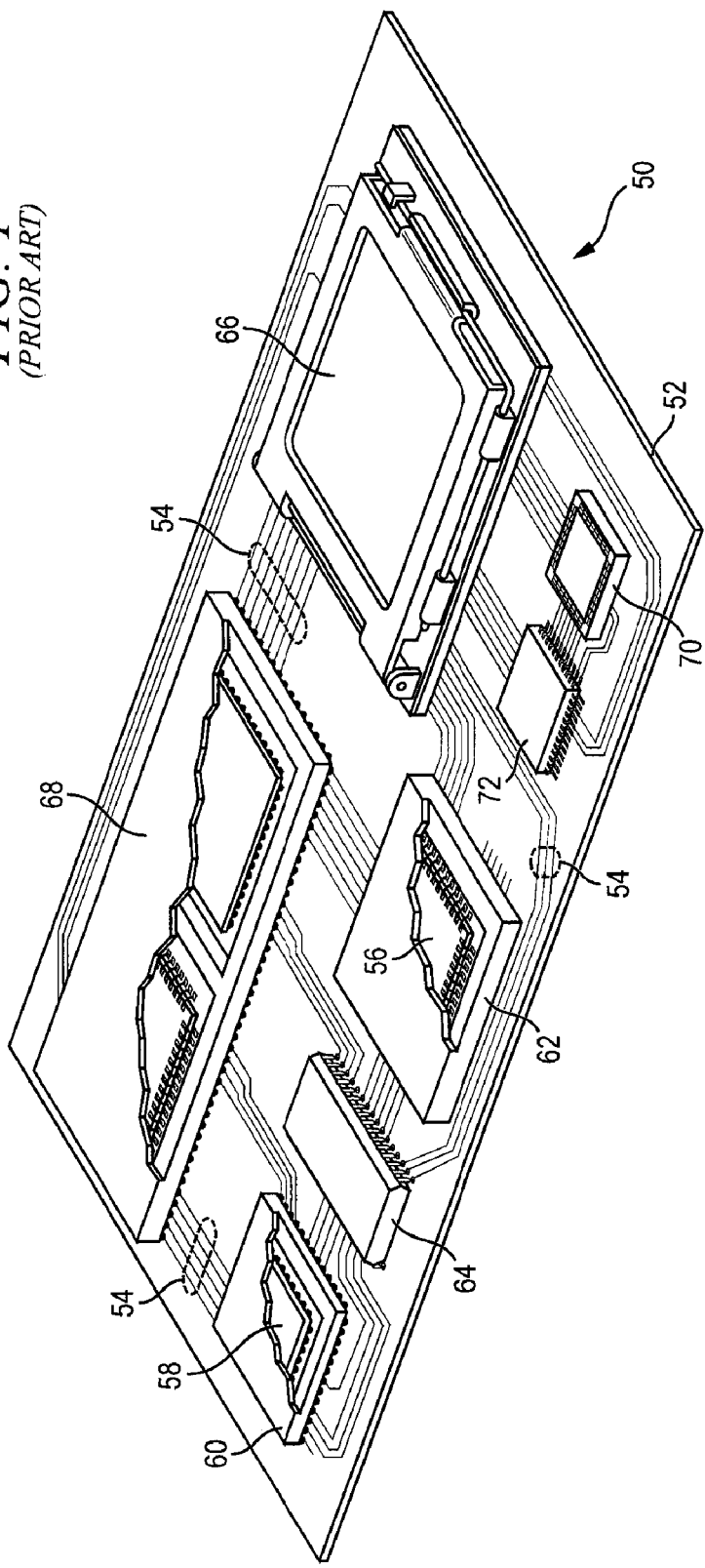
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
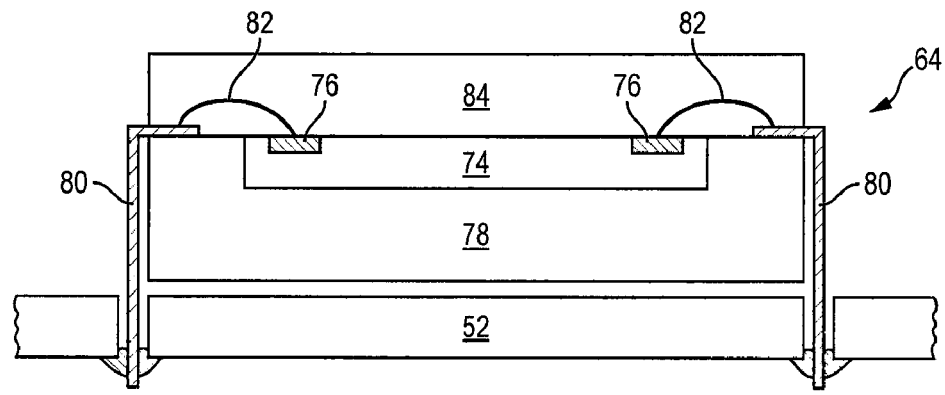
FIGS. 3a-3c illustrate further detail of the representative semiconductor packages mounted to the PCB.
Figure 3B:
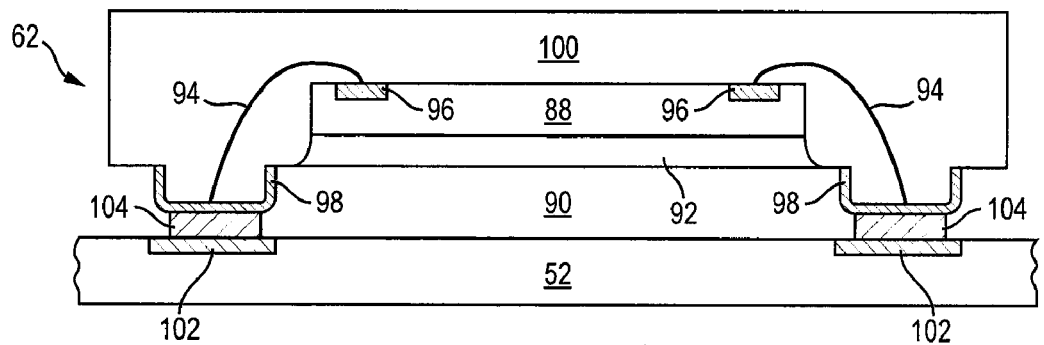
Figure 3C:
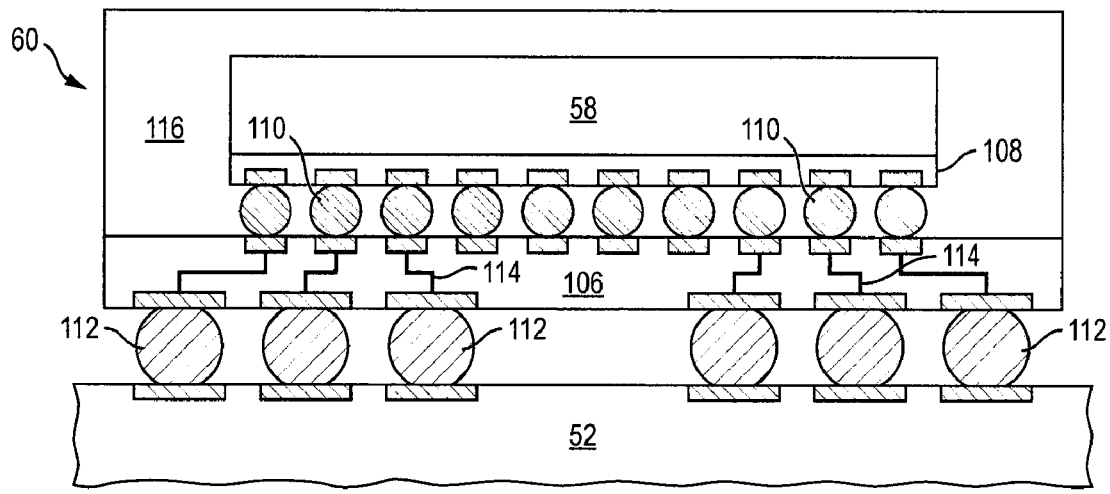

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4A:
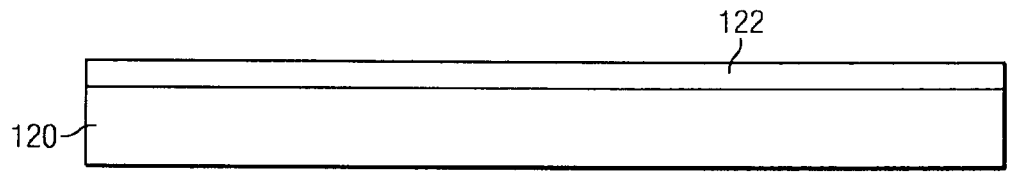
FIGS. 4a-4i illustrate a process of forming a WLCSP with an air gap adjacent to a stress sensitive region on the die.

FIGS. 4*a*-4*i* illustrate, in relation to FIGS. 2 and 3*a*-3*c*, a process of forming a WLCSP with an air gap adjacent to a stress sensitive region of the semiconductor die. In FIG. 4*a*, a sacrificial or temporary wafer level substrate or carrier 120 contains a base material such as silicon, polymer, polymer composite, metal foil, ceramic, glass, glass epoxy, beryllium oxide, tape, or other suitable low-cost, rigid material for structural support. An adhesive tape or layer 122 is formed over carrier 120. Adhesive layer 122 can be flexible plastic base film, such as polyvinyl chloride (PVC) or polyolefin, with a synthetic acrylic adhesive or ultraviolet (UV)-sensitive adhesive, for device mounting and removal. Adhesive layer 122 is releasable by light, heat, laser, or mechanical pressure. Alternatively, an adhesive material such as thermal epoxy, polymer composite, or inorganic bonding compounds, can be applied to carrier 120.

Figure 4B:
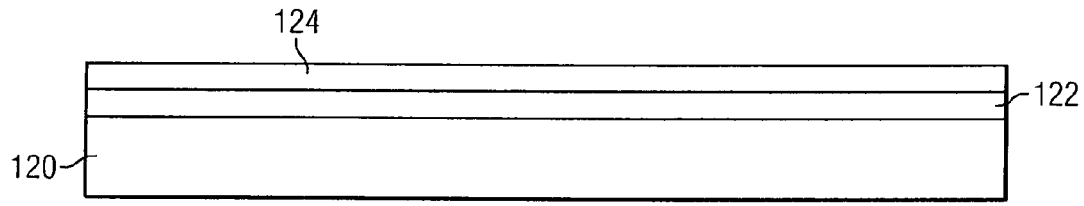

In FIG. 4*b*, an insulating or dielectric layer 124 is formed over adhesive layer 122 using PVD, CVD, printing, spin coating, spray coating, or thermal oxidation. The insulating layer 124 can be one or more layers of silicon dioxide (SiO2), silicon nitride (Si3N4), silicon oxynitride (SiON), tantalum pentoxide (Ta2O5), aluminum oxide (Al2O3), polyimide, benzocyclobutene (BCE), polybenzoxazoles (PBO), or other dielectric material having similar insulating and structural properties.

Figure 4C:
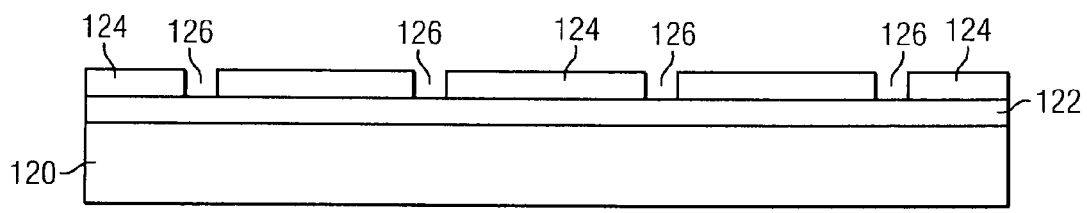
Figure 4D:
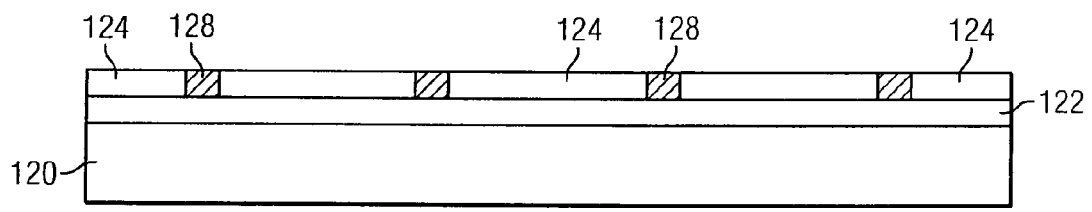

In FIG. 4*c*, a plurality of vias 126 is formed through insulating layer 124 using laser drilling or etching process. The vias extend through insulating layer 124 to adhesive layer 122. The vias are filled with Cu, Ni, nickel vanadium (NiV), Au, Al, or other wettable material using PVD, CVD, electrolytic plating, electroless plating process, or other suitable metal deposition process to form conductive via 128, as shown in FIG. 4*d*.

Figure 4E:
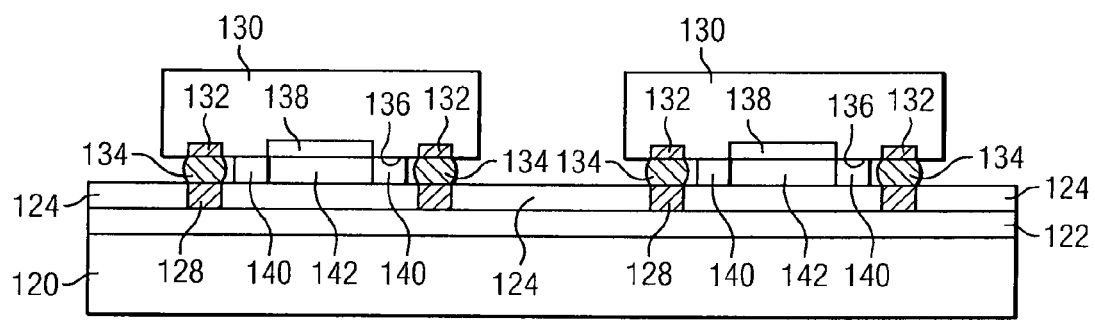
Figure 4F:
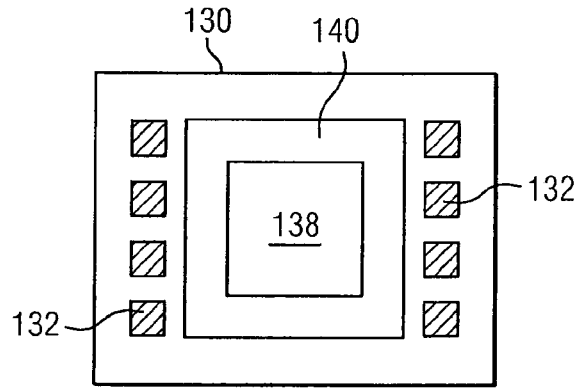

In FIG. 4*e*, a plurality of semiconductor die 130 with contact pads 132 oriented downward is mounted to conductive vias 128 with bumps 134. Each semiconductor die 130 includes an active surface 136 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 136 to implement analog circuits or digital circuits, such as digital signal processor (DSP), ASIC, memory, or other signal processing circuit. Semiconductor die 130 may also contain IPD, such as inductors, capacitors, and resistors, for RF signal processing. A typical RF system requires multiple IPDs in one or more semiconductor packages to perform the necessary electrical functions.

In particular, active region 136 includes a stress sensitive region 138 containing high frequency signal processing circuits. Any stress asserted against region 138, e.g. thermal stress, can adversely affect the signal processing of the die, cause device failures, or shorten life expectancy of the device. A dam 140 is formed around stress sensitive region 138 between active region 136 and insulating layer 124, as shown in bottom view of FIG. 4*f*. Dam 140 creates gap 142 adjacent to region 138 for isolation from various forms of stress, such as thermally induced stress.

Figure 4G:
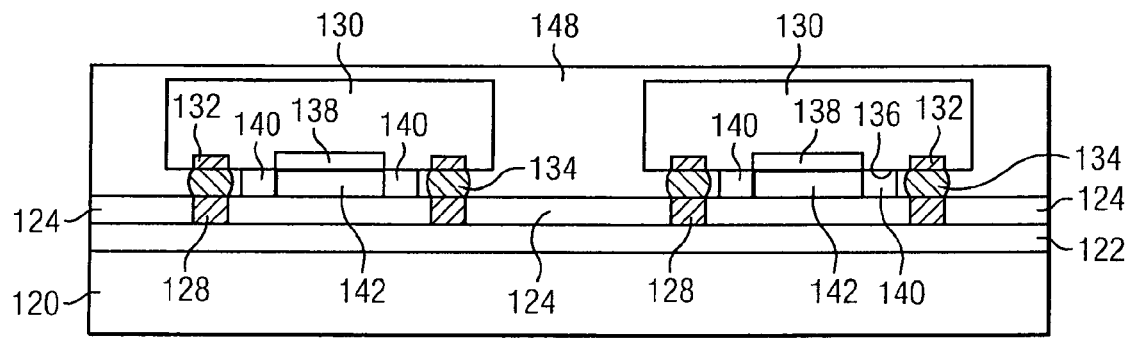

In FIG. 4*g*, an encapsulant or molding compound 148 is deposited over semiconductor die 130 and insulating layer 124 using a paste printing, compressive molding, transfer molding, liquid encapsulant molding, vacuum lamination, spin coating, or other suitable applicator. Encapsulant 148 can be polymer composite material, such as epoxy resin with filler, epoxy acrylate with filler, or polymer with proper filler. Encapsulant 148 is non-conductive and environmentally protects the semiconductor device from external elements and contaminants. Encapsulant 148 surrounds semiconductor die 130. However, dam 140 blocks encapsulant 148 from entering gap 142. Accordingly, dam 140 creates an air gap adjacent to stress sensitive region 138.

Figure 4H:
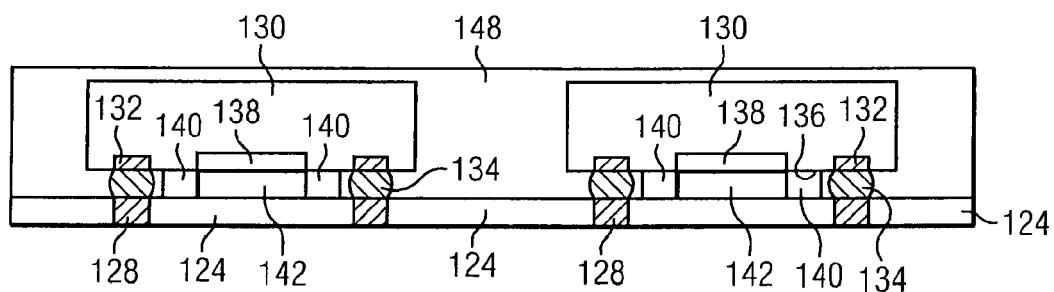

In FIG. 4*h*, carrier 120 and adhesive layer 122 are removed by light, heat, laser, or mechanical pressure. For example, carrier 120 and adhesive layer 122 can be removed by UV-light, thermal detach, chemical etching, mechanical peel-off, CMP, mechanical grinding, wet stripping, or other suitable detachment process.

Figure 4I:
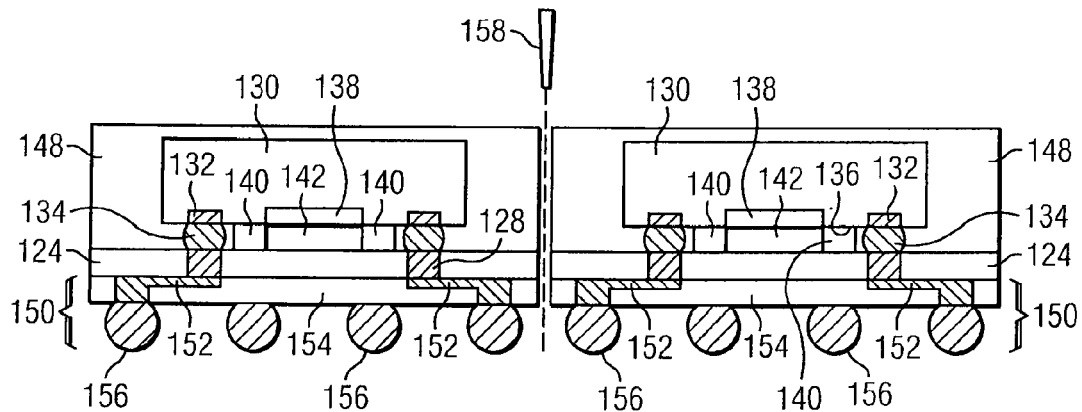

In FIG. 4*i*, a bottom-side build-up interconnect structure 150 is formed over insulating layer 124. The build-up interconnect structure 150 includes an electrically conductive layer 152 formed using patterning and PVD, CVD, electrolytic plating, electroless plating process, or other suitable metal deposition process. Conductive layer 152 can be one or more layers of Al, Cu, Sn, Ni, Au, Ag, or other suitable electrically conductive material. Conductive layer 152 is electrically connected to conductive vias 128 and contact pads 132.

The build-up interconnect structure 150 further includes an insulating or passivation layer 154 formed by PVD, CVD, printing, spin coating, spray coating, or thermal oxidation. The insulating layer 154 can be one or more layers of SiO2, Si3N4, SiON, Ta2O5, Al2O3, or other material having similar insulating and structural properties.

An electrically conductive bump material is deposited over conductive layer 152 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form spherical balls or bumps 156. In some applications, bumps 156 are reflowed a second time to improve electrical contact to conductive layer 152. The bumps can also be compression bonded to conductive layer 152. Bumps 156 represent one type of interconnect structure that can be formed over conductive layer 152. The interconnect structure can also use bond wires, conductive paste, stud bump, micro bump, or other electrical interconnect.

Figure 5:
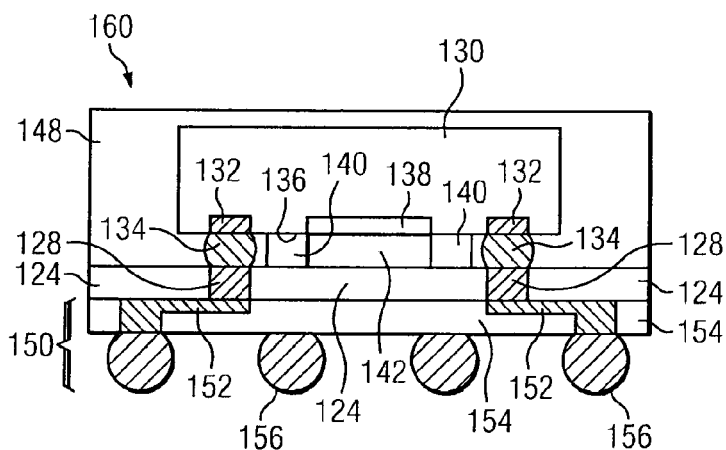
FIG. 5 illustrates an individual WLCSP with the air gap adjacent to the stress sensitive region on the die.

Semiconductor die 130 are singulated with saw blade or laser cutting tool 158 into individual semiconductor devices 160, as shown in FIG. 5. Semiconductor device 160 is a WLCSP with air gap 142 formed adjacent to stress sensitive region 138. Contact pads 132 of semiconductor die 130 are electrically connected to build-up interconnect structure 150 by way of conductive vias 128 and bumps 134 for further package integration. Air gap 142 eliminates stress on region 138 to avoid device failure and adverse influence on signal processing of semiconductor die 130.

Figure 6A:
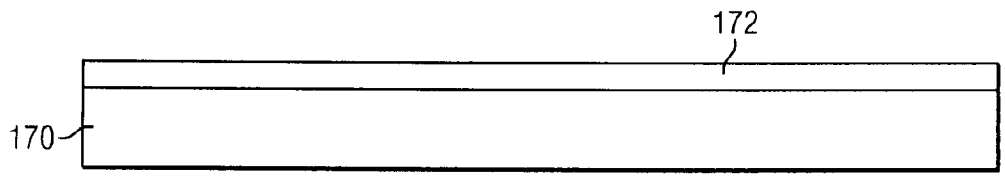
FIGS. 6a-6h illustrate an alternate process of forming the WLCSP with the air gap adjacent to stress sensitive region on the die.

FIGS. 6*a*-6*h* illustrate an alternate process of forming a WLCSP with an air gap adjacent to a stress sensitive region of the semiconductor die. In FIG. 6*a*, a sacrificial or temporary wafer level substrate or carrier 170 contains a base material such as silicon, polymer, polymer composite, metal foil, ceramic, glass, glass epoxy, beryllium oxide, tape, or other suitable low-cost, rigid material for structural support. An adhesive tape or layer 172 is formed over carrier 170. Adhesive layer 172 can be flexible plastic base film, such as PVC or polyolefin, with a synthetic acrylic adhesive or UV-sensitive adhesive, for device mounting and removal. Adhesive layer 172 is releasable by light, heat, laser, or mechanical pressure. Alternatively, an adhesive material such as thermal epoxy, polymer composite, or inorganic bonding compounds, can be applied to carrier 170.

Figure 6B:

In FIG. 6b, an insulating or dielectric layer 174 is formed over adhesive layer 172 using PVD, CVD, printing, spin coating, spray coating, or thermal oxidation. The insulating layer 174 can be one or more layers of SiO2, Si3N4, SiON, Ta2O5, Al2O3, polyimide, BCB, PBO, or other dielectric material having similar insulating and structural properties.

Figure 6C:
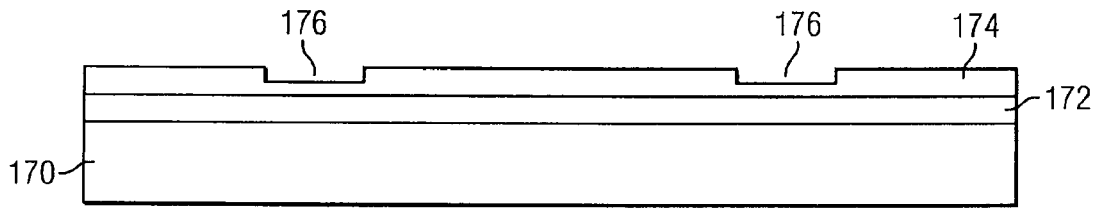

In FIG. 6c, a plurality of cavities or notches 176 is formed in insulating layer 174 using an etching process. The notches 176 extend partially through dielectric layer 174.

Figure 6D:
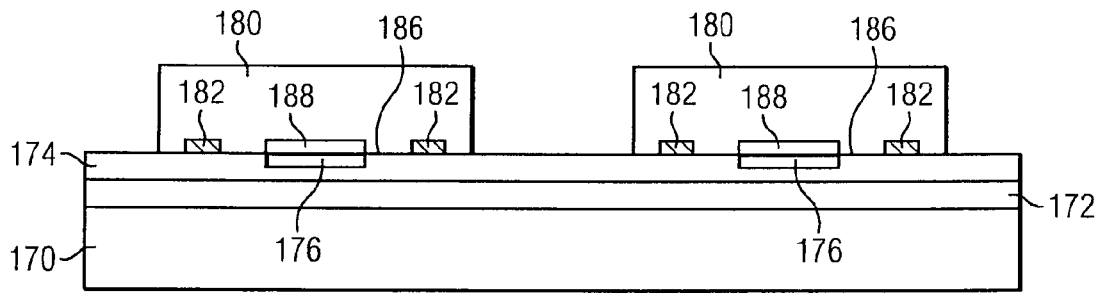

In FIG. 6d, a plurality of semiconductor die 180 is mounted to insulating layer 174 with contact pads 182 oriented downward. The contact area between active region 186 and insulating layer 174 isolates notch 176. Each semiconductor die 180 includes an active surface 186 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 186 to implement analog circuits or digital circuits, such as DSP, ASIC, memory, or other signal processing circuit. Semiconductor die 180 may also contain IPD, such as inductors, capacitors, and resistors, for RF signal processing.

In particular, active region 186 includes a stress sensitive region 188 containing high frequency signal processing circuits. Any stress asserted against region 188, e.g. thermally induced stress, can adversely affect the signal processing of the die, cause device failures, or shorten life expectancy of the device. In the embodiment shown in FIG. 6d, semiconductor die 180 is positioned with respect to carrier 170 such that stress sensitive region 188 is aligned over notch 176. Notch 176 creates a gap adjacent to stress sensitive region 188.

Figure 6E:
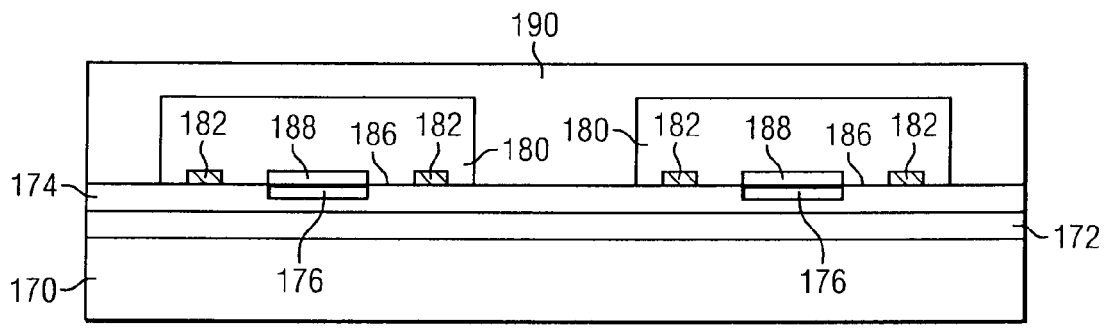

In FIG. 6e, an encapsulant or molding compound 190 is deposited over semiconductor die 180 and insulating layer 174 using a paste printing, compressive molding, transfer molding, liquid encapsulant molding, vacuum lamination, spin coating, or other suitable applicator. Encapsulant 190 can be polymer composite material, such as epoxy resin with filler, epoxy acrylate with filler, or polymer with proper filler. Encapsulant 190 is non-conductive and environmentally protects the semiconductor device from external elements and contaminants. Encapsulant 190 surrounds semiconductor die 180. However, encapsulant 190 is blocked from entering notch 176 because the notch is isolated by the contact area between active region 186 and insulating layer 174. Accordingly, the isolation of notch 176 by the contact area between active region 186 and insulating layer 174 creates an air gap adjacent to stress sensitive region 188.

Figure 6F:
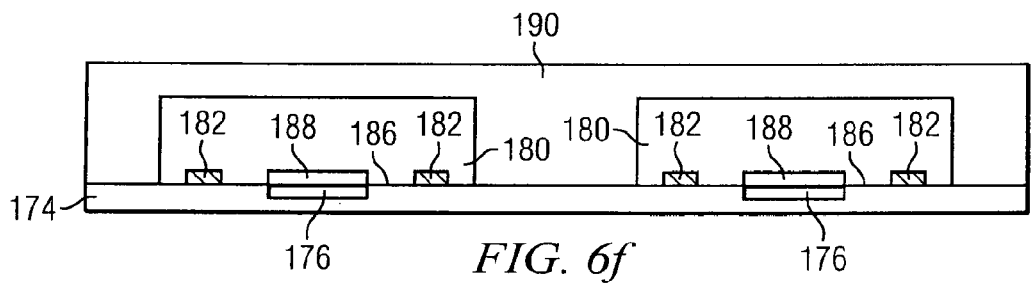

In FIG. 6f, carrier 170 and adhesive layer 172 are removed by light, heat, laser, or mechanical pressure. For example, carrier 170 and adhesive layer 172 can be removed by UV-light, thermal detach, chemical etching, mechanical peel-off, CMP, mechanical grinding, wet stripping, or other suitable detachment process.

Figure 6G:
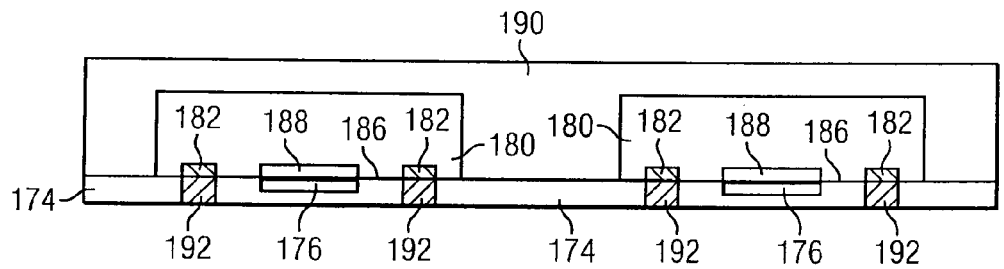

In FIG. 6g, a plurality of vias is formed through insulating layer 174 over contact pads 182 using laser drilling or etching process. The vias extend through insulating layer 174 to contact pads 182. The vias are filled with Cu, Ni, NiV, Au, Al, or other wettable material using PVD, CVD, electrolytic plating, electroless plating process, or other suitable metal deposition process to form conductive vias 192.

Figure 6H:
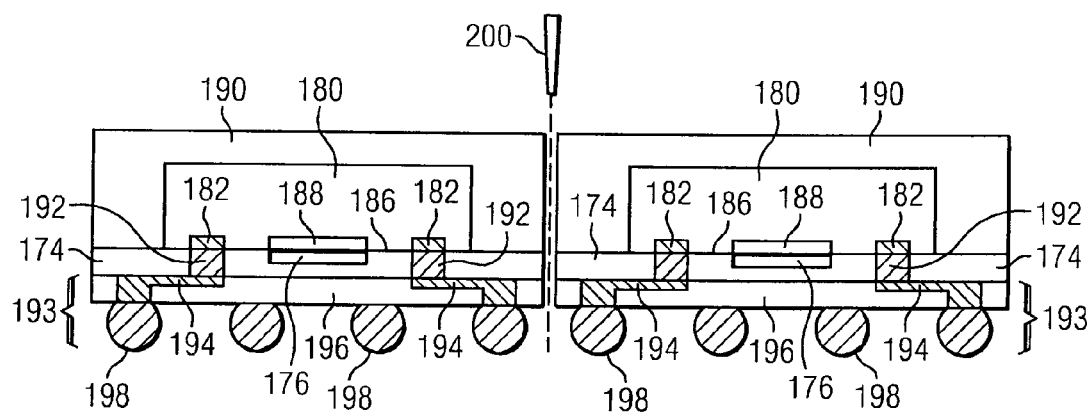

In FIG. 6h, a bottom-side build-up interconnect structure 193 is formed over insulating layer 174. The build-up interconnect structure 193 includes an electrically conductive layer 194 formed using patterning and PVD, CVD, electrolytic plating, electroless plating process, or other suitable metal deposition process. Conductive layer 194 can be one or more layers of Al, Cu, Sn, Ni, Au, Ag, or other suitable electrically conductive material. Conductive layer 194 is electrically connected to conductive vias 192 and contact pads 182.

The build-up interconnect structure 193 further includes an insulating or passivation layer 196 formed by PVD, CVD, printing, spin coating, spray coating, or thermal oxidation. The insulating layer 196 can be one or more layers of SiO2, Si3N4, SiON, Ta2O5, Al2O3, or other material having similar insulating and structural properties.

An electrically conductive bump material is deposited over conductive layer 194 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 194 using a suitable attachment or bonding process. In one embodiment, the bump material is reflowed by heating the material above its melting point to form spherical balls or bumps 198. In some applications, bumps 198 are reflowed a second time to improve electrical contact to conductive layer 194. The bumps can also be compression bonded to conductive layer 194. Bumps 198 represent one type of interconnect structure that can be formed over conductive layer 194. The interconnect structure can also use bond wires, conductive paste, stud bump, micro bump, or other electrical interconnect.

Figure 7:
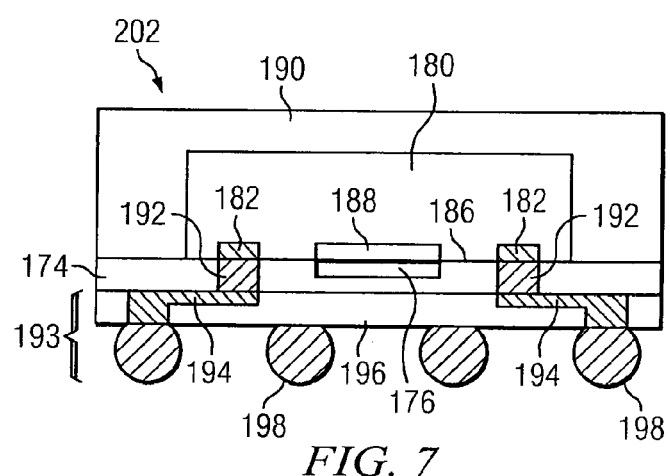
FIG. 7 illustrates the WLCSP of FIGS. 6a-6h with the air gap adjacent to the stress sensitive region.

Semiconductor die 180 are singulated with saw blade or laser cutting tool 200 into individual semiconductor devices 202, as shown in FIG. 7. Semiconductor device 202 is a WLCSP with air gap 176 formed adjacent to stress sensitive region 188. Contact pads 182 of semiconductor die 180 are electrically connected to build-up interconnect structure 193 by way of conductive vias 192 for further package integration. Air gap 176 eliminates stress on region 188 to avoid device failure and adverse influence on signal processing of semiconductor die 180.

Figure 8A:
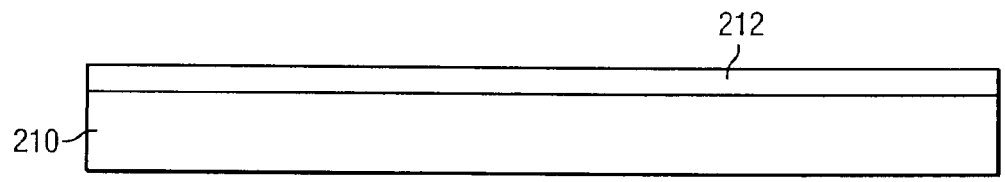
FIGS. 8a-8i illustrate an alternate process of forming the WLCSP with the air gap adjacent to stress sensitive region on the die.

FIGS. 8a-8i illustrate another process of forming a WLCSP with an air gap adjacent to a stress sensitive region of the semiconductor die. In FIG. 8a, a sacrificial or temporary wafer level substrate or carrier 210 contains a base material such as silicon, polymer, polymer composite, metal foil, ceramic, glass, glass epoxy, beryllium oxide, tape, or other suitable low-cost, rigid material for structural support. An adhesive tape or layer 212 is formed over carrier 210. Adhesive layer 212 can be flexible plastic base film, such as PVC or polyolefin, with a synthetic acrylic adhesive or UV-sensitive adhesive, for device mounting and removal. Adhesive layer 212 is releasable by light, heat, laser, or mechanical pressure. Alternatively, an adhesive material such as thermal epoxy, polymer composite, or inorganic bonding compounds, can be applied to carrier 210.

Figure 8B:
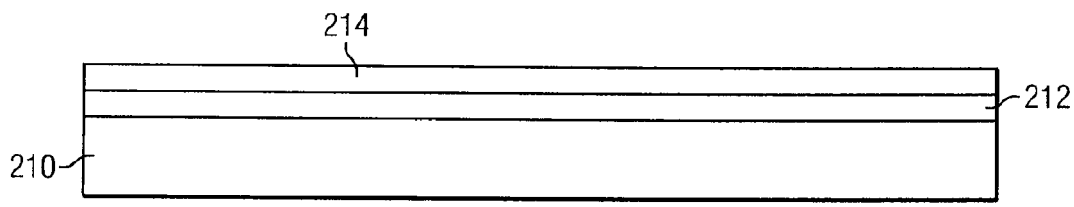

In FIG. 8b, an insulating or dielectric layer 214 is formed over adhesive layer 212 using PVD, CVD, printing, spin coating, spray coating, or thermal oxidation. The insulating layer 214 can be one or more layers of SiO2, Si3N4, SiON, Ta2O5, Al2O3, polyimide, BCB, PBO, or other dielectric material having similar insulating and structural properties.

Figure 8C:
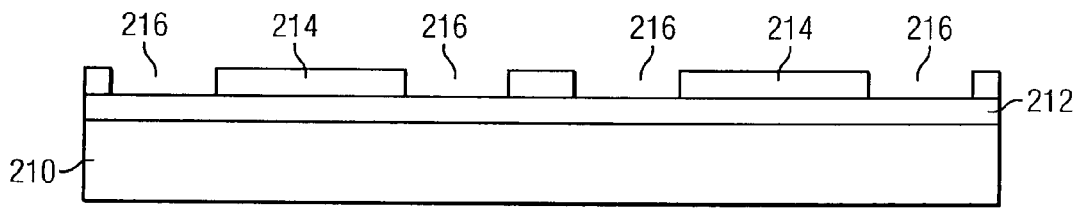
Figure 8D:
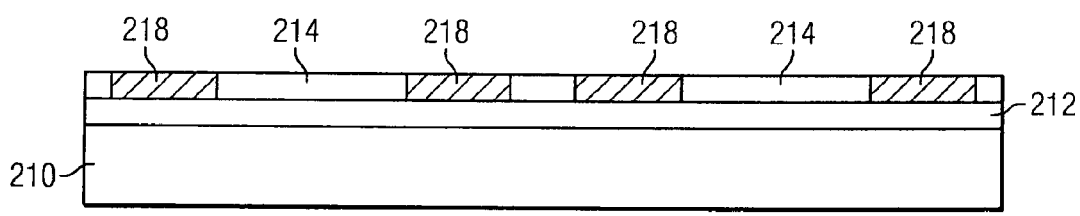

In FIG. 8c, a plurality of openings 216 is formed through insulating layer 214 using laser drilling or etching process. The openings 216 extend through insulating layer 214 to adhesive layer 212. The openings 216 are filled with Cu, Ni, NiV, Au, Al, or other wettable material using PVD, CVD, electrolytic plating, electroless plating process, or other suitable metal deposition process to form conductive layer 218, as shown in FIG. 8d.

Figure 8E:
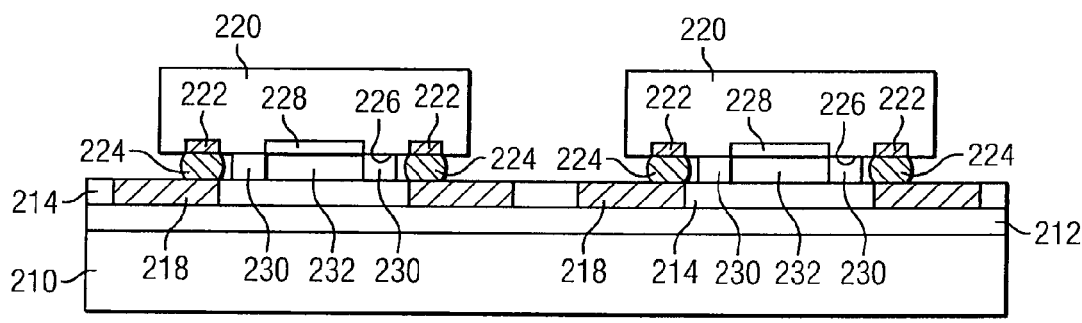
Figure 8F:
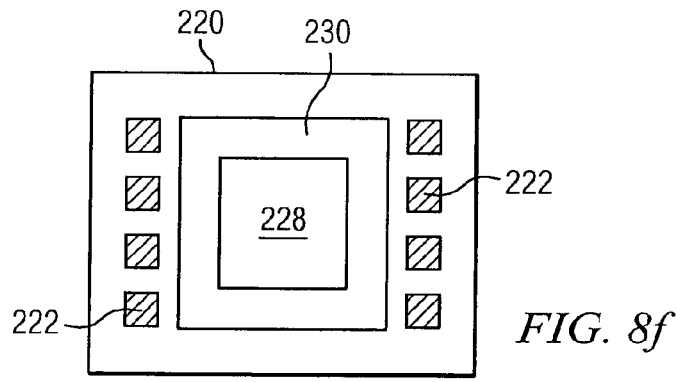

In FIG. 8e, a plurality of semiconductor die 220 with contact pads 222 oriented downward is mounted to conductive layer 218 with bumps 224. Each semiconductor die 220 includes an active surface 226 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 226 to implement analog circuits or digital circuits, such as DSP, ASIC, memory, or other signal processing circuit. Semiconductor die 220 may also contain IPD, such as inductors, capacitors, and resistors, for RF signal processing.

In particular, active region 226 includes a stress sensitive region 228 containing high frequency signal processing circuits. Any stress asserted against region 228, e.g. thermally induced stress, can adversely affect the signal processing of the die, cause device failures, or shorten life expectancy of the device. A dam 230 is formed around stress sensitive region 228 between active region 226 and insulating layer 214, as shown in bottom view of FIG. 8f. Dam 230 creates gap 232 around region 228 for isolation from various forms of stress, such as thermally induced stress.

Figure 8G:
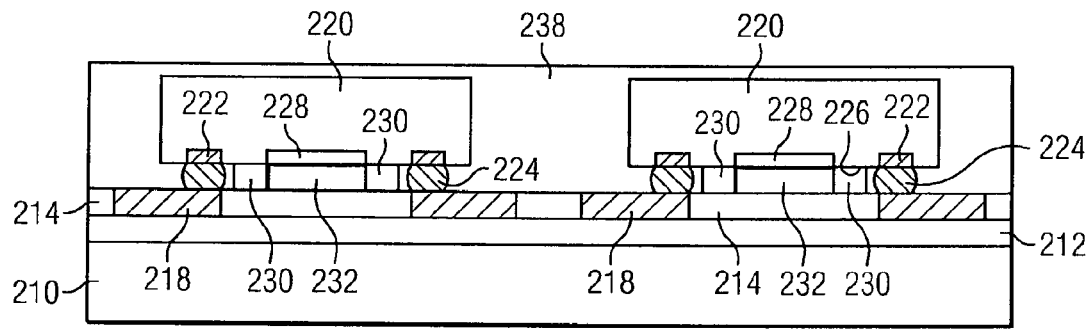

In FIG. 8g, an encapsulant or molding compound 238 is deposited over semiconductor die 220 and insulating layer 214 using a paste printing, compressive molding, transfer molding, liquid encapsulant molding, vacuum lamination, spin coating, or other suitable applicator. Encapsulant 238 can be polymer composite material, such as epoxy resin with filler, epoxy acrylate with filler, or polymer with proper filler. Encapsulant 238 is non-conductive and environmentally protects the semiconductor device from external elements and contaminants. Encapsulant 238 surrounds semiconductor die 220. However, dam 230 blocks encapsulant 238 from entering gap 232. Accordingly, dam 230 creates an air gap adjacent to stress sensitive region 228.

Figure 8H:
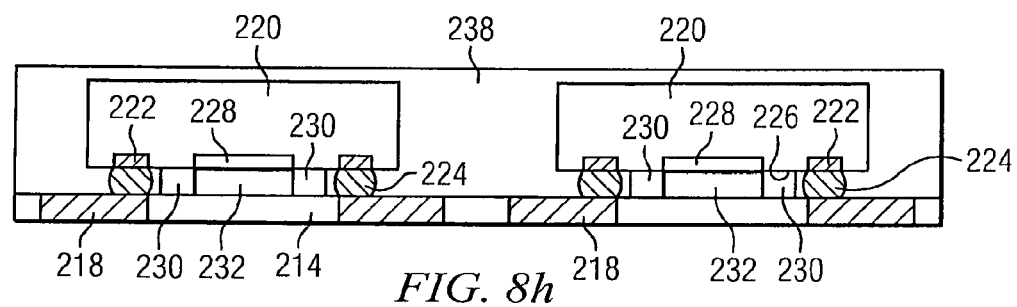

In FIG. 8h, carrier 210 and adhesive layer 212 are removed by light, heat, laser, or mechanical pressure. For example, carrier 210 and adhesive layer 212 can be removed by UV-light, thermal detach, chemical etching, mechanical peel-off, CMP, mechanical grinding, wet stripping, or other suitable detachment process.

Figure 8I:
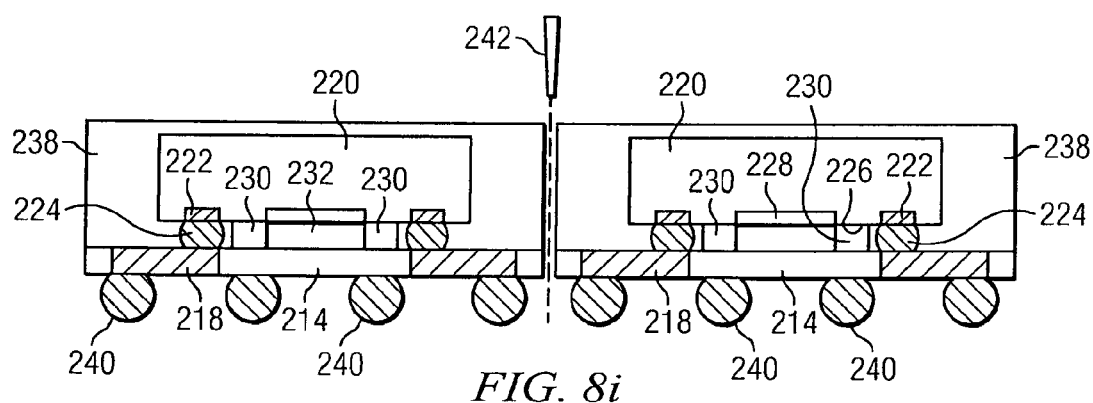

In FIG. 8i, an electrically conductive bump material is deposited over conductive layer 218 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 218 using a suitable attachment or bonding process. In one embodiment, the bump material is reflowed by heating the material above its melting point to form spherical balls or bumps 240. In some applications, bumps 240 are reflowed a second time to improve electrical contact to conductive layer 218. The bumps can also be compression bonded to conductive layer 218. Bumps 240 represent one type of interconnect structure that can be formed over conductive layer 218. The interconnect structure can also use bond wires, conductive paste, stud bump, micro bump, or other electrical interconnect.

Figure 9:
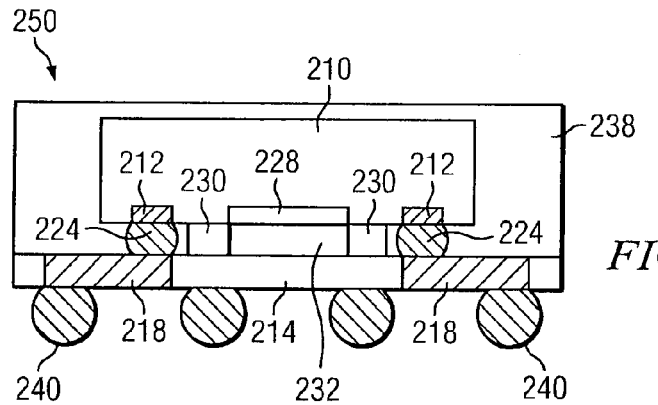
FIG. 9 illustrates the WLCSP of FIGS. 8a-8i with the air gap adjacent to the stress sensitive region.

Semiconductor die 220 are singulated with saw blade or laser cutting tool 242 into individual semiconductor devices 250, as shown in FIG. 9. Semiconductor device 250 is a WLCSP with air gap 232 formed adjacent to stress sensitive region 228. Contact pads 222 of semiconductor die 220 are electrically connected to bumps 240 by way of bumps 224 and conductive layer 218 for further package integration. Air gap 232 eliminates stress on region 228 to avoid device failure and adverse influence on signal processing of semiconductor die 220.

Figure 10:
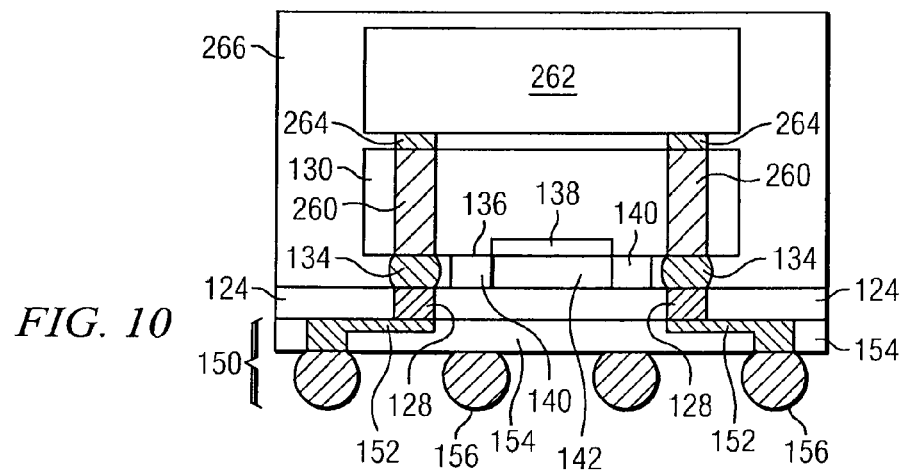
FIG. 10 illustrates the WLCSP with stacked semiconductor die.

FIG. 10 shows WLCSP 258 with stacked semiconductor die and an air gap adjacent to the stress sensitive region. Continuing with the structure described in FIGS. 4a-4e, a plurality of vias is formed through semiconductor die 130 using laser drilling, mechanical drilling, or etching process, such as deep reactive ion etching (DRIE). The vias are filled with Al, Cu, Sn, Ni, Au, Ag, titanium (Ti), W, poly-silicon, or other suitable electrically conductive material using electrolytic plating, electroless plating process, or other suitable metal deposition process to form conductive through silicon vias (TSV) 260.

Semiconductor die 262 is mounted to a back surface of semiconductor die 130, opposite active surface 136, with bumps 264. Semiconductor die 262 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. In another embodiment, a discrete semiconductor device can be mounted to semiconductor die 130.

An encapsulant or molding compound 266 is deposited over semiconductor die 130 and 262 and insulating layer 124 using a paste printing, compressive molding, transfer molding, liquid encapsulant molding, vacuum lamination, spin coating, or other suitable applicator. Encapsulant 266 can be polymer composite material, such as epoxy resin with filler, epoxy acrylate with filler, or polymer with proper filler. Encapsulant 266 is non-conductive and environmentally protects the semiconductor device from external elements and contaminants. Encapsulant 266 surrounds semiconductor die 130 and 262. However, dam 140 blocks encapsulant 266 from entering gap 142. Accordingly, dam 140 creates an air gap adjacent to stress sensitive region 138. The manufacturing process continues as described in FIGS. 4h-4i for the stacked semiconductor die 130 and 262 in WLCSP 258.

In WLCSP 258, air gap 142 is formed adjacent to stress sensitive region 138. Semiconductor die 130 and 262 are electrically connected to bumps 156 by way of conductive pillars 260, bumps 134 and 264, conductive vias 128, and conductive layer 152. Air gap 142 eliminates stress on region 138 to avoid device failure and adverse influence on signal processing of semiconductor die 130.

Figure 11:
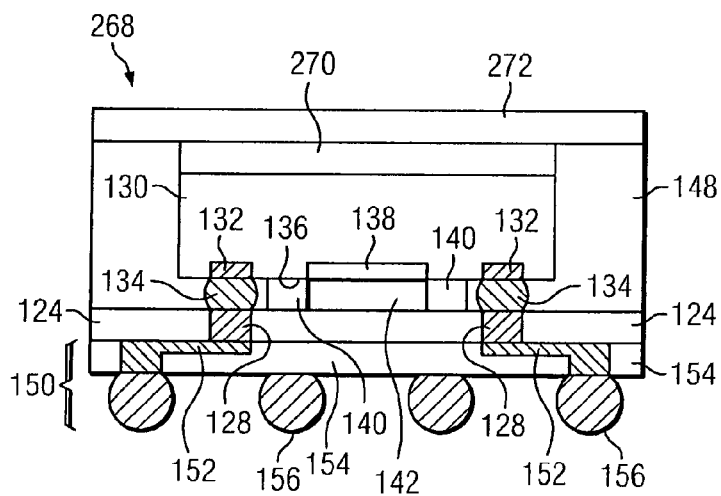
FIG. 11 illustrates the WLCSP with thermal interface material and heat sink.

FIG. 11 shows an embodiment of WLCSP 268 with an air gap adjacent to the stress sensitive region and heat sink. Continuing with the structure described in FIGS. 4a-4i, a portion of encapsulant 148 over semiconductor die 130 is removed by an etching process. A thermal interface material (TIM) 270 is deposited over the back surface of semiconductor die, opposite active surface 136. TIM 270 can be aluminum oxide, zinc oxide, boron nitride, or pulverized silver. A heat sink 272 is mounted over TIM 270 and encapsulant 148. Heat sink 272 can be Al, Cu, or another material with high thermal conductivity to provide heat dissipation for semiconductor die 130. TIM 270 aids in the distribution and dissipation of heat generated by semiconductor die 130.

Figure 12:
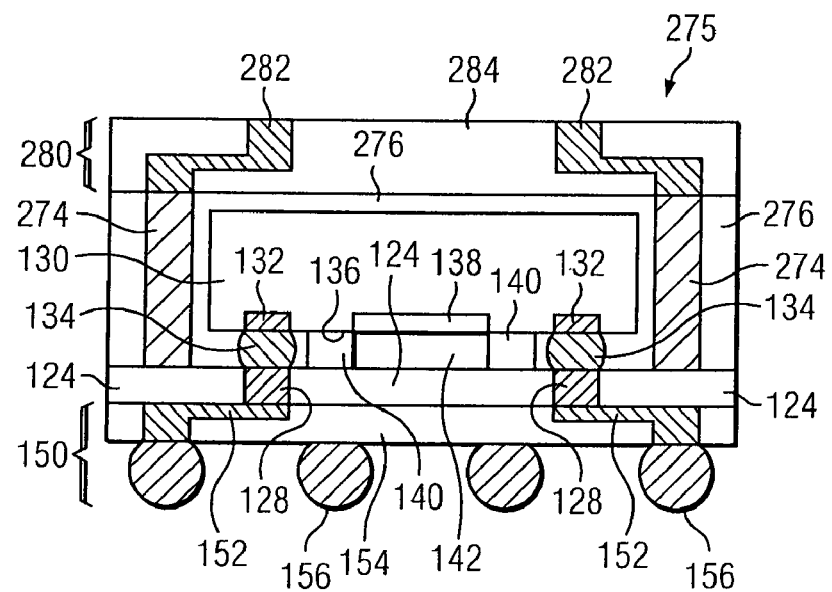
FIG. 12 illustrates the WLCSP with topside and bottom-side build-up interconnect structures.

FIG. 12 shows an embodiment of WLCSP 275 with an air gap adjacent to the stress sensitive region and topside interconnect structure. Continuing with the structure described in FIGS. 4a-4e, an encapsulant or molding compound 276 is deposited over semiconductor die 130 using a paste printing, compressive molding, transfer molding, liquid encapsulant molding, vacuum lamination, spin coating, or other suitable applicator. Encapsulant 276 can be polymer composite material, such as epoxy resin with filler, epoxy acrylate with filler, or polymer with proper filler. Encapsulant 276 is non-conductive and environmentally protects the semiconductor device from external elements and contaminants.

A plurality of vias is formed through encapsulant 276 using laser drilling, mechanical drilling, or etching process, such as DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive pillars 274. In another embodiment, conductive pillars 274 can be formed as stud bumps, through mold vias, or stacked bumps.

Encapsulant 276 surrounds semiconductor die 130. However, dam 140 blocks encapsulant 276 from entering gap 142. Accordingly, dam 140 creates an air gap adjacent to stress sensitive region 138. The manufacturing process continues as described in FIGS. 4h-4i to form bottom-side build-up interconnect structure 150.

In addition, a topside build-up interconnect structure 280 includes an electrically conductive layer 282 formed using patterning and PVD, CVD, electrolytic plating, electroless plating process, or other suitable metal deposition process. Conductive layer 282 can be one or more layers of Al, Cu, Sn, Ni, Au, Ag, or other suitable electrically conductive material. Conductive layer 282 is electrically connected to conductive pillars 274, conductive vias 128, bumps 134, and contact pads 132.

The build-up interconnect structure 280 further includes an insulating or passivation layer 284 formed by PVD, CVD, printing, spin coating, spray coating, or thermal oxidation. The insulating layer 284 can be one or more layers of SiO2, Si3N4, SiON, Ta2O5, Al2O3, or other material having similar insulating and structural properties.

Figure 13:
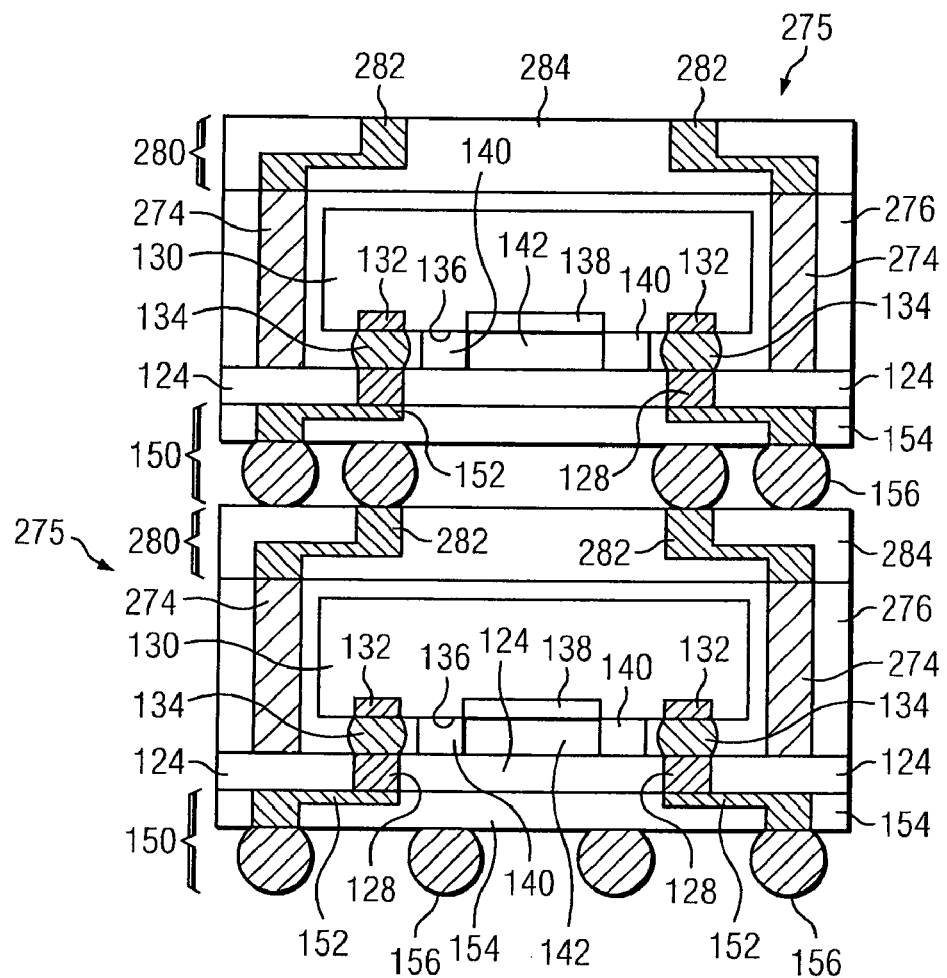
FIG. 13 illustrates two stacked WLCSP with topside and bottom-side build-up interconnect structures.

FIG. 13 shows two stacked WLCSP 275 electrically interconnected by bottom-side build-up interconnect structure 150 and topside build-up interconnect structure 280. In each WLCSP, air gap 142 is formed adjacent to stress sensitive region 138. Contact pads 132 of semiconductor die 130 are electrically connected to bumps 156 by way of bumps 134, conductive layers 152 and 282, conductive vias 128, and conductive pillars 274. Air gap 142 eliminates stress on region 138 to avoid device failure and adverse influence on signal processing of semiconductor die 130.

Figure 14:
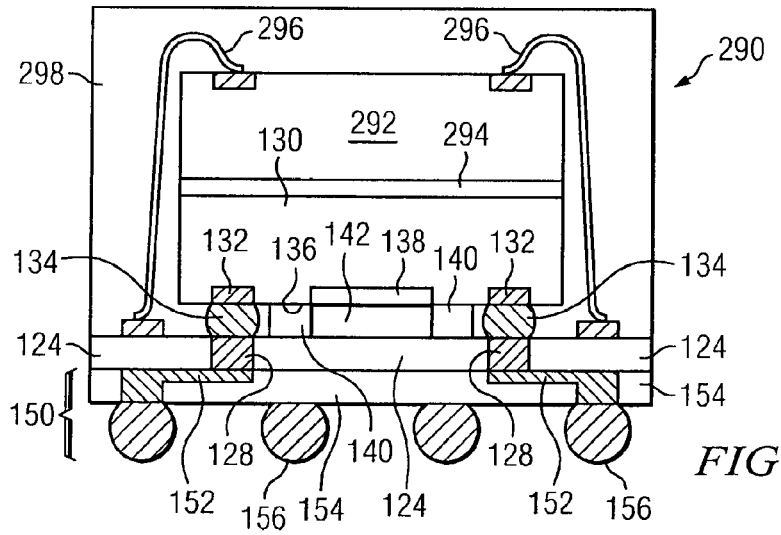
FIG. 14 illustrates the WLCSP with stacked semiconductor die electrically interconnected with bond wires.

FIG. 14 shows WLCSP 290 with stacked semiconductor die and an air gap adjacent to the stress sensitive region. Continuing with the structure described in FIGS. 4a-4e, semiconductor die 292 is mounted to a back surface of semiconductor die 130, opposite active surface 136, with adhesive layer 294. Semiconductor die 292 includes an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 292 may also contain IPD, such as inductors, capacitors, and resistors, for RF signal processing. Semiconductor die 292 is electrically connected to conductive layer 152 with bond wires 296.

An encapsulant or molding compound 298 is deposited over semiconductor die 130 and 292 using a paste printing, compressive molding, transfer molding, liquid encapsulant molding, vacuum lamination, spin coating, or other suitable applicator. Encapsulant 298 can be polymer composite material, such as epoxy resin with filler, epoxy acrylate with filler, or polymer with proper filler. Encapsulant 298 is non-conductive and environmentally protects the semiconductor device from external elements and contaminants. Encapsulant 298 surrounds semiconductor die 130 and 292. However, dam 140 blocks encapsulant 298 from entering gap 142. Accordingly, dam 140 creates an air gap adjacent to stress sensitive region 138. The manufacturing process continues as described in FIGS. 4h-4i for the stacked semiconductor die 130 and 292 in WLCSP 290.

In WLCSP 290, air gap 142 is formed adjacent to stress sensitive region 138. Semiconductor die 130 and 292 are electrically connected to bumps 156 by way of bond wires 296, bumps 134, conductive vias 128, and conductive layer 152. Air gap 142 eliminates stress on region 138 to avoid device failure and adverse influence on signal processing of semiconductor die 130.

Figure 15:
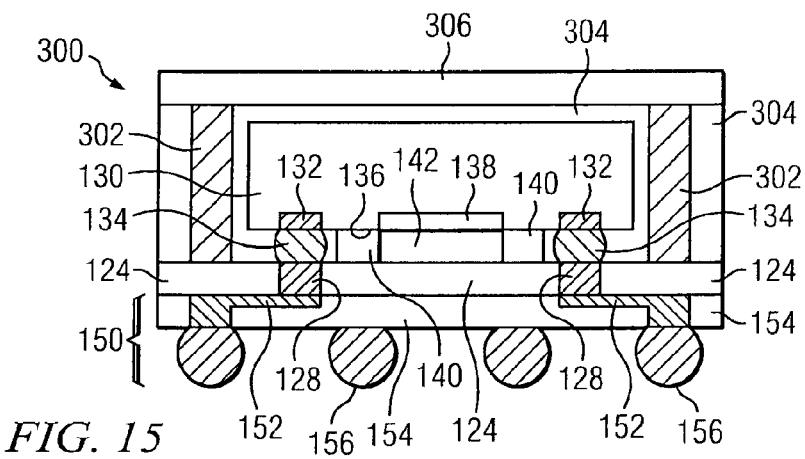
FIG. 15 illustrates the WLCSP with an EMI shielding layer.

FIG. 15 shows an embodiment of WLCSP 300 with an air gap adjacent to the stress sensitive region and EMI shielding. Continuing with the structure described in FIGS. 4a-4e, an encapsulant or molding compound 304 is deposited over semiconductor die 130 and around conductive pillars 302 using a paste printing, compressive molding, transfer molding, liquid encapsulant molding, vacuum lamination, spin coating, or other suitable applicator. Encapsulant 304 can be polymer composite material, such as epoxy resin with filler, epoxy acrylate with filler, or polymer with proper filler. Encapsulant 304 is non-conductive and environmentally protects the semiconductor device from external elements and contaminants.

A plurality of vias is formed through encapsulant 304 using laser drilling, mechanical drilling, or etching process, such as DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive pillars 302. In another embodiment, conductive pillars 302 can be formed as stud bumps or stacked bumps.

Encapsulant 304 surrounds semiconductor die 130. However, dam 140 blocks encapsulant 304 from entering gap 142. Accordingly, dam 140 creates an air gap adjacent to stress sensitive region 138. The manufacturing process continues as described in FIGS. 4h-4i to form bottom-side build-up interconnect structure 150.

A shielding layer 306 is formed over or mounted to encapsulant 304. Shielding layer 306 can be Cu, Al, ferrite or carbonyl iron, stainless steel, nickel silver, low-carbon steel, silicon-iron steel, foil, epoxy, conductive resin, and other metals and composites capable of blocking or absorbing electromagnetic interference (EMI), radio frequency interference (RFI), and other inter-device interference. Shielding layer 306 can also be a non-metal material such as carbon-black or aluminum flake to reduce the effects of EMI and RFI. Shielding layer 306 is grounded through conductive pillars 302, conductive vias 128, and conductive layer 152.

Figure 16:
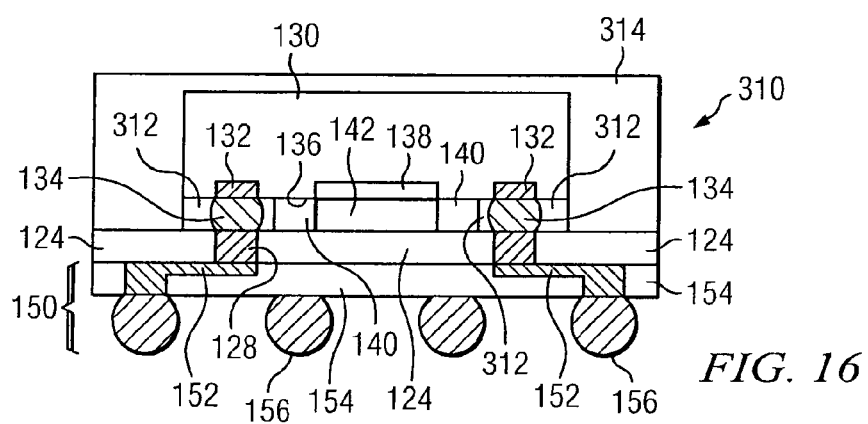
FIG. 16 illustrates the WLCSP with an underfill material deposited beneath the semiconductor die.

FIG. 16 shows WLCSP 310 with an air gap adjacent to the stress sensitive region. Continuing with the structure described in FIGS. 4a-4e, an underfill material 312, such as epoxy resin, is deposited under semiconductor die 130.

An encapsulant or molding compound 314 is deposited over semiconductor die 130 using a paste printing, compressive molding, transfer molding, liquid encapsulant molding, vacuum lamination, spin coating, or other suitable applicator. Encapsulant 314 can be polymer composite material, such as epoxy resin with filler, epoxy acrylate with filler, or polymer with proper filler. Encapsulant 314 is non-conductive and environmentally protects the semiconductor device from external elements and contaminants. Encapsulant 314 surrounds semiconductor die 130. However, dam 140 blocks encapsulant 314 from entering gap 142. Accordingly, dam 140 creates an air gap adjacent to stress sensitive region 138. The manufacturing process continues as described in FIGS. 4h-4i for semiconductor die 130.

In WLCSP 310, air gap 142 is formed adjacent to stress sensitive region 138. Contact pads 132 of semiconductor die 130 are electrically connected to bumps 156 by way of bumps 134, conductive vias 128, and conductive layer 152. Air gap 142 eliminates stress on region 138 to avoid device failure and adverse influence on signal processing of semiconductor die 130.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a temporary substrate;
    forming a first insulating layer over the temporary substrate;
    forming a first conductive layer in the first insulating layer;
    providing a first semiconductor die including a stress sensitive region;
    disposing the first semiconductor die over the first insulating layer and electrically connected to the first conductive layer with dam material between the first semiconductor die and first insulating layer adjacent to the stress sensitive region;
    depositing an encapsulant over the first semiconductor die while the dam material blocks the encapsulant leaving a gap between the stress sensitive region and first insulating layer;
    removing the temporary substrate; and
    forming a first build-up interconnect structure over the first insulating layer by,
        (a) forming a second insulating layer over the first insulating layer, and
        (b) forming a second conductive layer within the second insulating layer with the gap isolating the stress sensitive region from the first build-up interconnect structure.

2. The method of claim 1, further including stacking a second semiconductor die over a surface of the first semiconductor die opposite the stress sensitive region of the first semiconductor die.

3. The method of claim 2, further including electrically connecting the first and second semiconductor die with bumps or bond wires.

4. The method of claim 1, further including forming a shielding layer or heat sink over a surface of the first semiconductor die opposite the stress sensitive region of the first semiconductor die.

5. The method of claim 1, further including depositing underfill material around the dam material under the first semiconductor die.

6. The method of claim 1, further including:
    forming a second build-up interconnect structure over a surface of the encapsulant opposite the first build-up interconnect structure; and
    forming a conductive pillar between the first build-up interconnect structure and second build-up interconnect structure.

7. A method of making a semiconductor device, comprising:
    providing a temporary substrate;
    forming a first insulating layer over the temporary substrate;
    forming a first conductive layer in the first insulating layer;
    providing a first semiconductor die including a stress sensitive region;
    disposing the first semiconductor die over the first insulating layer with dam material between the first semiconductor die and first insulating layer adjacent to the stress sensitive region;
    depositing an encapsulant over the first semiconductor die leaving a gap between the stress sensitive region and first insulating layer for stress isolation;
    removing the temporary substrate; and
    forming a first build-up interconnect structure over the first insulating layer.

8. The method of claim 7, further including stacking a second semiconductor die over a surface of the first semiconductor die opposite the stress sensitive region of the first semiconductor die.

9. The method of claim 7, further including forming a shielding layer or heat sink over a surface of the first semiconductor die opposite the stress sensitive region of the first semiconductor die.

10. The method of claim 7, further including depositing underfill material around the dam material under the first semiconductor die.

11. The method of claim 7, further including:
    forming a second build-up interconnect structure over a surface of the encapsulant opposite the first build-up interconnect structure; and
    forming a conductive pillar between the first build-up interconnect structure and second build-up interconnect structure.

12. The method of claim 7, wherein forming the first interconnect structure includes:
    forming a second conductive layer; and
    forming a second insulating layer over the second conductive layer.

13. A method of making a semiconductor device, comprising:
    providing a first insulating layer;
    forming a first conductive layer in the first insulating layer;
    providing a first semiconductor die including a stress sensitive region;
    disposing the first semiconductor die over the first insulating layer with dam material between the first semiconductor die and first insulating layer adjacent to the stress sensitive region;

depositing an encapsulant over the first semiconductor die leaving a gap between the stress sensitive region and first insulating layer for stress isolation; and forming a first interconnect structure over the first insulating layer.

14. The method of claim 13, further including disposing a second semiconductor die over the first semiconductor die.

15. The method of claim 13, further including forming a conductive via through the first semiconductor die.

16. The method of claim 13, further including disposing a shielding layer or heat sink over the first semiconductor die.

17. The method of claim 13, further including forming a second interconnect structure over a surface of the encapsulant opposite the first interconnect structure.

18. The method of claim 13, further including forming a vertical interconnect structure through the encapsulant.

19. A method of making a semiconductor device, comprising:

providing a first interconnect structure;

providing a first semiconductor die including a stress sensitive region;

disposing the first semiconductor die over the first interconnect structure with dam material between the first semiconductor die and first interconnect structure adjacent to the stress sensitive region; and forming an encapsulant over the first interconnect structure leaving a gap between the stress sensitive region and first interconnect structure for stress isolation.

20. The method of claim 19, further including disposing a second semiconductor die over the first semiconductor die.

21. The method of claim 19, further including forming a conductive via through the first semiconductor die.

22. The method of claim 19, further including disposing a shielding layer or heat sink over the first semiconductor die.

23. The method of claim 19, further including forming a second interconnect structure over a surface of the encapsulant opposite the first interconnect structure.

24. The method of claim 19, further including forming a vertical interconnect structure through the encapsulant.

25. The method of claim 19, further including:

stacking a plurality of semiconductor devices; and electrically connecting the stacked semiconductor devices through the first interconnect structure.

* * * * *